METAL-DEGENERATE SEMICONDUCTOR-INSULATOR-METAL SANDWICH EXHIBITING VOLTAGE CONTROLLED NEGATIVE RESISTANCE CHARACTERISTICS

Filed April 25, 1966

*INVENTORS*
LEO ESAKI
WEBSTER E. HOWARD, JR.
PHILLIP J. STILES

*BY*

S. P. Tedesco

ATTORNEY

United States Patent Office 3,445,733
Patented May 20, 1969

3,445,733

METAL-DEGENERATE SEMICONDUCTOR-INSULATOR-METAL SANDWICH EXHIBITING VOLTAGE CONTROLLED NEGATIVE RESISTANCE CHARACTERISTICS

Leo Esaki, Chappaqua, and Webster E. Howard, Jr., and Phillip J. Stiles, Yorktown Heights, N.Y., assignors to International Business Machines Corporation, Armonk, N.Y., a corporation of New York Filed Apr. 25, 1966, Ser. No. 545,046
Int. Cl. H01l 3/10
U.S. Cl. 317—234 12 Claims

ABSTRACT OF THE DISCLOSURE

A two-terminal active circuit device exhibiting voltage-controlled negative resistance characteristics comprises a thin layer of insulating material, not substantially greater than 100 A., sandwiched in laminate fashion between a metallic layer and a degenerate-doped semiconductor layer. The insulating material and the semiconductor material are selected to particularly relate to the quantity $eV_c$, i.e., the energy difference at the interface between the bottoms of the respective conduction bands in the semiconductor and insulating materials, and the quantity $eV_v$, i.e., the energy difference at the interface between the tops of the respective valence bands in the semiconductor and insulating materials. When degenerate n-type semiconductor material is used, such relationship is given by $V_v<V_c$; when degenerate p-type semiconductor material is used, such relationship is given $V_c<V_v$. Since the probability of tunneling through the insulating layer involves parameters $V_c$ and $V_v$, voltage-controlled negative resistance characteristics are obtained when an applied voltage of proper polarity is applied across the laminate structure.

This invention relates to a two-terminal active circuit device exhibiting negative resistance.

The property of negatve resistance in active circuit devices, i.e., a decrease in current flow with increasing voltage, is attributable to quantum-mechanical tunneling of carriers through a potential barrier. Such active devices are desirable for circuit applications since they are adaptable for bistable operation and can exhibit very fast switching speeds. Although the phenomenon of quantum-mechanical tunneling has been known, interest in active devices exhibiting negative resistance has been stimulated by the development of the "tunnel diode." The tunnel diode has attracted widespread attention due to its mechanical simplicity, very fast switching speeds, and, also, adaptability to digital computer circuits. The principle of operation of the tunnel diode has been reported in "New Phenomenon in Narrow Germanium P-N Junctions," by L. Esaki, Physical Review, vol. 109, page 603, 1958, and, also, has been described in the R. Esaki et al. Patent 3,033,174, issued on May 8, 1962. Basically, a tunnel diode comprises an abrupt p-n junction between two very highly-doped contiguous semiconductor regions of opposite-conductivity types in a single crystalline entity.

In addition, prior art efforts to develop active circuit devices exhibiting negative resistance have produced structures wherein quantum-mechanical tunneling of carriers is effected through a thin dielectric layer, i.e., up to 300 A., interpositioned between very highly-doped semiconductor regions of opposite-conductivity types. For example, a laminate active circuit device of such type is described in the F. W. Schmidlin Patent 3,024,140, issued on May 6, 1962 wherein each of the semiconductor regions has a doping concentration in the order of $10^{20}$ carriers per cubic centimeter, the dielectric layer preventing breakdown and, also, limiting the tunneling probability, i.e., defines a potential barrier, of carriers between such regions. In such structure, the semiconductor regions of opposite-conductivity types have overlapping energy bands defining occupied and unoccupied energy states whereby quantum-mechanical tunneling of carriers is effected through the dielectric layer and between corresponding occupied and unoccupied energy states.

The active circuit device of this invention is formed in laminate fashion, for example, by vapor deposition techniques, and is distinguishable over prior art devices in comprising a thin dielectric layer sandwiched between an ordinary metallic layer and a degenerate, or highly-doped, semiconductor layer. When appropriate conditions are met, the active device exhibits a current-voltage characteristic having a negative resistance similar to that of the conventional tunnel diode. Such negative resistance is due to the voltage dependence of tunnelling probability of carriers through the thin dielectric layer and upon the continuous availability of unoccupied energy states in the energy band of the degenerate semiconductor material to support quantum-mechanical tunneling.

An object of this invention is to provide a novel active circuit device exhibiting negative resistance.

Another object of this invention is to provide an improved active circuit device of microminiature dimensions and which is simple to fabricate.

Another object of this invention is to provide a novel semiconductor active device exhibiting negative resistance and suitably adapted to batch fabrication techniques.

In accordance with this invention, the degenerate semiconductor material and the dielectric material forming the laminate active circuit device are selected such that the quantities $eV_c$ and $eV_v$ are particularly related where $eV_c$ is the energy difference at the interface between the bottom of the conduction band in the semiconductor material and the bottom of the conduction band in the dielectric material and $eV_v$ is the energy difference at the interface between the top of the valence band in the semiconductor material and the top of the valence band in the dielectric material. By such definition, the presence of electric fields at equilibrium are considered. For example, when degenerate n-type semiconductor material is utilized, such relationship is given by $V_v<V_c$; when degenerate p-type semiconductor material is utilized, this relationship is given by $V_c<V_v$. Because the probability of carriers tunneling through the thin dielectric layer involves such parameters as $V_c$ and $V_v$, a negative resistance is obtained.

The magnitude of current in the laminate active circuit device, as applied voltage is increased, depends upon (1) the average tunneling probability of carriers through the thin dielectric layer, and (2) the number of carriers available for "tunneling." When $V_c$ and $V_v$ are properly related and applied voltage has a proper polarity, the average tunneling probability reduces whereas the number of carriers avaliable for "tunneling" initially increases with increasing applied voltage and the laminate active circuit device exhibits a positive resistance. As the Fermi level in the ordinary metallic layer is moved toward energy levels corresponding to the forbidden region in the semiconductor layer, the number of unoccupied energy states supporting the tunneling process increases continuously. However, when the Fermi level in the metallic layer approaches and, also, corresponds to levels in the forbidden region in the semiconductor layer, the number of available carriers, or unoccupied energy states, is substantially unchanged whereas the tunneling probability of carriers continues to decrease and the laminate active circuit device exhibits a negative resistance. Such negative resistance in the active device is supported, to a first approximation, by that applied voltage range whereat the Fermi level in the metallic layer corresponds to the forbidden region in the semiconductor material. With further increases in applied voltage, the number of carriers available for "tunneling" increases whereby laminate active circuit device again exhibits a positive resistance region, i.e., increasing current with increasing applied voltage.

The foregoing and other objects, features, and advantages of the invention will be apparent from the following more particular description of preferred embodiments of the invention, as illustrated in the accompanying drawings.

Figure 1:
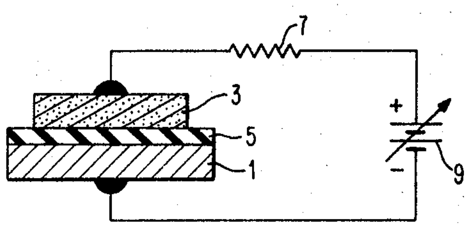
FIG. 1 is a cross-sectional view of the active circuit device of this invention.

The active circuit device of this invention is illustrated in FIG. 1 as comprising a layer 1 of ordinary metal, e.g., aluminum (Al), tantalum (Ta), lead (Pb), tin (Sn), gold (Au), niobium (Nb), indium (In), magnesium (Mg), etc., and an active layer 3 of semiconductor material. A thin dielectric layer 5 is formed between and contiguous with metallic layer 1 and active layer 3. The active layer 3 is degenerate such that, by definition, the Fermi level $E_{f3}$ is outside the forbidden region $E_{g3}$ and lying within the valence band when doped p-type and within the conduction band when doped n-type.

In forming the structure of FIG. 1, metallic layer 1, either of sufficient thickness to be self-supporting or supported on an appropriate substrate, not shown, is exposed to an oxidizing atmosphere, e.g., air, to form dielectric layer 5. In the preferred embodiment, metallic layer 1 is formed of aluminum (Al) and exposed to the atmosphere for a few minutes to form dielectric layer 5 of aluminum oxide ($Al_2O_3$). Alternatively, a suitable dielectric material, e.g., aluminum oxide ($Al_2O_3$), silicon dioxide ($SiO_2$), a wide gap semiconductor, etc., can be formed by vapor deposition or other conventional techniques, over metallic layer 1. Active layer 3 of degenerate semiconductor material, e.g., tin telluride (SnTe), is formed over dielectric layer 5 by conventional techniques. Dielectric layer 5 should be sufficiently thin, e.g., not substantially greater than 100 A., to allow controlled quantum-mechanical tunneling of carriers therethrough when metallic layer 1 and active layer 3 are biased along resistor 7 by variable voltage source 9.

Figures 3A, 3B, 3C, 3D:
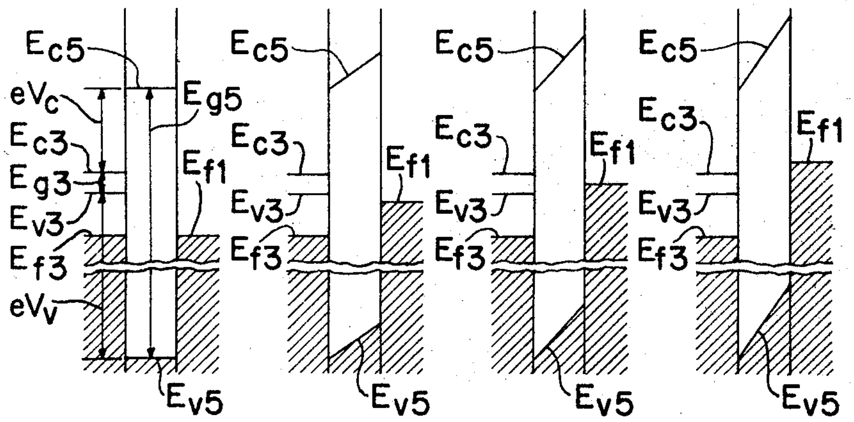
FIGS. 3A through 3D illustrate the energy band diagrams for various voltages applied across the laminate structure of FIG. 1 when the semiconductor material is degenerate p-type and wherein the energy bands of the dielectric material are assumed to be flat for the zero bias condition.
Figures 4A, 4B, 4C, 4D:
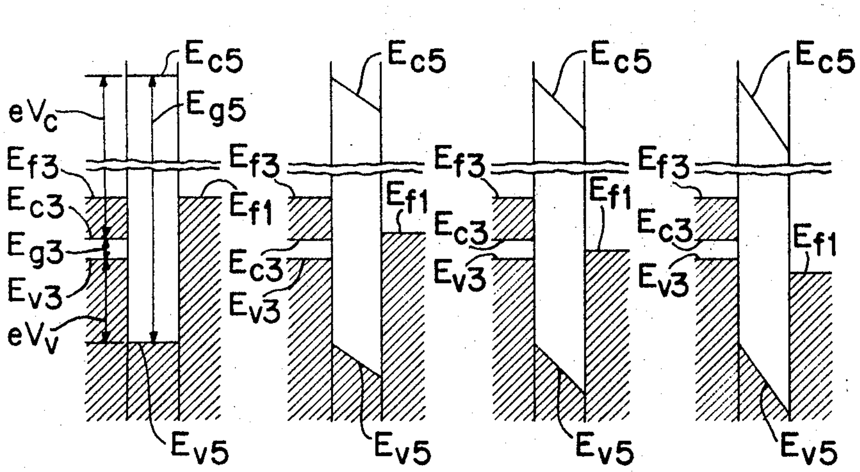
FIGS. 4A through 4D illustrate the energy band diagrams for various voltages applied across the laminate structure of FIG. 1 when the semiconductor material is degenerate n-type and wherein the energy bands of the dielectric material are assumed to be flat for the zero bias condition.

The energy band of the semiconductor material forming active layer 3 is particularly related to that of dielectric layer 5. When active layer 3 is formed of degenerate p-type semiconductor material, such material is selected such that the energy difference $eV_c$ between the bottoms of the respective conduction bands is less than the energy difference $eV_v$ between the tops of the respective valence bands as shown in FIG. 3A. Conversely, when active layer 3 is formed of degenerate n-type semiconductor material, the energy difference $eV_v$ is less than the energy difference $eV_c$ as shown in FIG. 4A. For example, active layer 3 can be formed of the following elemental or compound semiconductor materials or alloys formed thereof: Group IV elements—Si, Ge, etc.; Group II–VI compounds—ZnSe, ZnTe, CdSe, CdTe, HgSe, etc.; Group III–V compounds—InSb, InAs, GaSb, GaAs, GaP, etc.; and, Group IV–VI compounds—Pb salts, SnTe, GeTe, etc.

Figure 2:
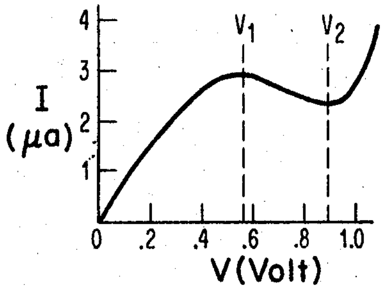
FIG. 2 illustrates the current-voltage characteristics of the active circuit device of FIG. 1 when formed in laminate fashion of aluminum, aluminum oxide, and tin telluride materials.

When $V_v$ and $V_c$ are properly related as shown in FIGS. 3A and 4A, an increasing voltage applied by source 9 between metallic layer 1 and active layer 3 supports tunneling current through dielectric layer 5, such tunneling current decreasing in magnitude with increasing voltage within a given voltage range $V_1$–$V_2$ as shown in FIG. 2. Conditions requisite for obtaining a negative resistance characteristic in the laminate structure of FIG. 1 are that: (1) dielectric layer 5 is sufficiently thin to allow controlled tunneling of carriers between metallic layer 1 and active layer 3; (2) active layer 3 is formed of degenerately-doped semiconductor material, either p-type or n-type; and, (3) a proper relationship between the energy bands of active layer 3 and insulating layer 5. When such conditions are met, the laminate structure of FIG. 1 exhibits the current-voltage characteristics such as shown in FIG. 2, the instantaneous magnitude of tunneling current being dependent upon (1) the average tunneling probability of carriers through the dielectric layer 5 and (2) the number of available tunneling carriers, each of these quantities being dependent upon the applied voltage across metallic layer 1 and active layer 3, i.e., the displacement of the Fermi level $E_{f1}$ from equilibrium.

For example, the energy bands of an unbiased laminate active circuit device as shown in FIG. 1 are illustrated in FIG. 3A wherein active layer 3 is formed of degenerate p-type tin telluride (SnTe), e.g., $1\times10^{21}$ carriers/cm.$^3$. As illustrated, the energy levels at the bottom of the conduction and valence bands of active layer 3 are identified as $E_{c3}$ and $E_{v3}$, a forbidden region of energy levels intermediate $E_{c3}$ and $E_{v3}$ is identified as $E_{g3}$. Since active layer 3 is degenerate p-type, Fermi level $Ef_3$ is within the valence band of active layer 3 and defines a boundary between occupied and unoccupied energy levels, or states. Hence, those energy levels between $E_{v3}$ and the Fermi level $Ef_3$ in active layer 3 are unoccupied and will remain continuously available to carriers, i.e., electrons, tunneling through insulating layer 5. The energy difference between the bottoms of conduction bands $E_{c3}$ and $E_{c5}$ of active layer 3 and dielectric layer 5, respectively, are identified by $eV_c$; the energy difference between the respective tops of the valence bands $E_{v3}$ and $E_{v5}$ of the active layer 3 and dielectric layer 5, respectively, are identified by $eV_v$. In the tin telluride-aluminum oxide system, $eV_c$ and $eV_v$ are given as 2 ev. and 6 ev., respectively, such that $V_c<V_v$.

Under zero bias condition, Fermi level $E_{f1}$ in metallic layer 1 and Fermi level $E_{f3}$ in active layer 3 are at a same energy level as shown in FIG. 3A. The energy diagram of FIG. 3A, although peculiar to the tin telluride-aluminum oxide-aluminum system, is representative of other systems wherein other materials are substituted. Accordingly, there is no tunneling of carriers, for example, electrons, through dielectric layer 5 since equivalent, or corresponding, energy states in metallic layer 1 and active layer 3 are either occupied or unoccupied. Successive FIGS. 3B through 3D illustrate the effect of increasing voltage applied by source 9 across metallic layer 1 and active layer 3 and have been keyed to FIG. 2. As shown in FIG. 3B, as the applied voltage is increased from zero, the Fermi level $E_{f1}$ in metallic layer 1 is raised from equilibrium and through energy levels corresponding to unoccupied energy states in active layer 3; accordingly, conduction and valence bands $E_{c5}$ and $E_{v5}$ in dielectric layer 5 become tilted so as to match Fermi levels $Ef_1$ and $Ef_3$ in metallic layer 1 and active layer 3, respectively. As the applied voltage is increased toward $V_1$, the number of unoccupied energy states, i.e., holes, in active layer 3 corresponding to occupied energy levels, i.e., electrons, in metallic layer 1 is increasing. At this time, the average probability of carriers tunneling through dielectric layer 5 decreases exponentially. For example, at equilibrium conditions, the tunneling probability of a carrier at a particular energy state is related to the thickness and, also, the height of the potential barrier presented by dielectric layer 5 as measured from the particular energy state to the bottom of the conduction band $E_{c5}$. In matching the Fermi level $E_{f1}$ and $E_{f3}$ in metallic layer 1 and active layer 3, the width of the potential barrier presented by dielectric layer 5 remains constant whereas the height of such carrier initially increases and is approximately given by $E_0+\frac{1}{2}eV$, where $E_0$ is the height of such barrier under equilibrium conditions and V is the applied voltage across dielectric layer 5. However, the probability of a carrier tunneling through such barrier is given by the expression $$\exp\left(-\frac{2\sqrt{2m}}{\hbar}d\sqrt{E_0+1/2eV}\right)$$

where $\hbar$ is Planck's constant;
$m$ is the effective mass of carriers; and
$d$ is the barrier width.

As seen in this expression, the probability of such carrier or electron tunneling through dielectric layer 5 decreases with increasing voltage.

Accordingly, as the Fermi level $E_{f1}$ is raised from equilibrium, an increasing number of carriers, i.e., electrons, in metallic layer 1 have a total energy corresponding to unoccupied energy levels in active layer 3. By accepted quantum-mechanical tunneling theory, such carriers tunnel through and appear across the dielectric layer 5 and define the tunneling current. Initially, the average tunneling probability of carriers through dielectric layer 5 is high but reduces exponentially with increasing applied voltage; also, since the density of states is progressively less in unoccupied higher-energy states in the valence band, the number of available carriers increases sublinearly and approaches a constant value as the Fermi level $E_{f1}$ in metallic layer 1 is raised to an energy corresponding to the top of the valence band $E_{v3}$ in active layer 3. Accordingly, as the applied voltage is increased toward $V_1$, the average tunneling probability of carriers is initially high and the increased number of unoccupied states predominates whereby the magnitude of tunneling current through dielectric layer 5 increases and the active circuit through dielectric layer 5 increases and the active circuit device exhibits a low voltage, positive resistance. As applied voltage is further increased, the energy bands of insulating layer 5 are titled as shown in FIG. 3B and the average tunneling probability is reduced; correspondingly, the Fermi level $E_{f1}$ in metallic layer 1 is raised to a level slightly below the top of valence band $E_{v3}$ of active layer 3 whereat the absolute values of the rate of decrease in the average tunneling probability and the rate of increase in the number of available carriers, respectively, are equal and a peak tunneling current $I_p$ is obtained. As the applied voltage is increased above $V_1$ and toward $V_2$, the magnitude of tunneling current begins to decrease as indicated by the negative resistance portion of the curve of FIG. 2 since the number of available carriers remains substantially constant whereas the height of the potential barrier presented by dielectric layer 5 continues to increase. As the applied voltage is further increased toward $V_2$, i.e., the Fermi level $E_{f1}$ of metallic layer 1 is raised through energy levels corresponding to the forbidden region $E_{g3}$ in active layer 3 as shown in FIG. 3C, no additional carriers become available while the average tunneling probability further reduces and the magnitude of tunneling current further decreases.

As the applied voltage is increased above $V_2$, the Fermi level $E_{f1}$ in metallic layer 1 is raised above an energy level corresponding to the bottom of the conduction band $E_{c3}$ in active layer 3 as shown in FIG. 3D. At this time, additional unoccupied energy states have become available and electrons tunnel from metallic layer 1 into the conduction band and, also, into the valence band of active layer 3. For increasing applied voltages in excess of $V_2$, the magnitude of tunneling current through dielectric layer 5 increases since the average tunneling probability and, also, the number of available carriers increase whereby the laminate structure to FIG. 1 exhibits a high voltage, positive resistance as shown in FIG. 2. As the voltage applied to the laminate structure of FIG. 1 is increased from zero and above voltage $V_2$, unoccupied energy states are continuously present in active layer 3 of opposite occupied energy states in metallic layer 1; thus, tunneling current does not fall to zero, as illustrated in the curve of FIG. 2.

Similarly, the combined energy diagram when active layer 3 is formed on degenerate n-type material is shown in FIG. 4A wherein similar reference characters have been employed. When degenerate n-type material is employed, tunneling current can be described as supported by electrons tunneling from active layer 3 and through dielectric layer 5. During equilibrium conditions, Fermi level $E_{f3}$ is within the conduction band $E_{c3}$ in active layer 3 and Fermi level $E_{f1}$ in metallic layer 1 is established at a corresponding energy level. When metallic layer 1 is biased positively, Fermi level $E_{f1}$ in metallic layer 1 is moved through lower energy levels whereby the energy distribution of unoccupied energy states and occupied energy states in metallic layer 1 and active layer 3, respectively, is shifted. As the positive applied voltage is increased toward $V_1$, the number of unoccupied energy states in metallic layer 1 opposing occupied energy states in active layer 3 increases so as to establish conditions for tunneling of electrons through dielectric layer 5. Again, the energy bands of active layer 5 become canted, or tilted, to balance the Fermi levels $E_{f1}$ and $E_{f3}$ in metallic layer 1 and active layer 3, respectively, as illustrated in the successive energy diagrams of FIGS. 3B, 3C, and 3D. As the Fermi level $E_{f1}$ in metallic layer 1 is displaced from equilibrium, the availability of carriers, i.e., unoccupied energy states in metallic layer 1, increases whereas the average tunneling probability decreases such that a low voltage, positive resistance is obtained. When the positive applied voltage is equal to $V_1$, the Fermi level $E_{f1}$ in metallic layer 1 is displaced to a level slightly above the bottom of conduction band $E_{c3}$ in active layer 3 as shown in FIG. 4B, the absolute value of the rate of decrease in the average tunneling probability and the absolute value of the rate of increase in the number of available carriers are equal whereby a peak current is obtained (cf., FIG. 2). Again, the number of available carriers remains substantially constant whereas the probability of such carriers tunneling through the potential barrier continues to decrease with the applied voltage range $V_1$–$V_2$ such that the laminate active device exhibits a negative resistance characteristic. The number of carriers available for tunneling remains substantially constant while the Fermi level $E_{f3}$ in metallic layer 1 is being swept across the forbidden region $E_{g1}$ in active layer 3 as shown in FIG. 4C. When the applied voltage is in excess of $V_2$ and the Fermi level $E_{f1}$ in metallic layer 1 has been reduced below the top of the valence band $E_{v3}$ in active layer 3 as shown in FIG. 4D, the number of available carriers, i.e., electrons, increases and the average tunneling probability of these additional electrons increases with further increase in applied voltage such that a high voltage, positive resistance region is obtained.

The above-identified illustrative embodiments are susceptible of numerous modifications clearly within the spirit and scope of the invention. For example, any number of distinct active layers or distinct metallic layers can be deposited onto a thin dielectric layer formed over a common metallic layer or common active layer whereby a common terminal is provided for a plurality of active circuit devices of this invention. Such distinct layers can be batch-fabricated, i.e., concurrently, and the resulting active devices interconnected by conventional metallization techniques. Also, it is evident that two or more active circuit devices can be formed in electrical tandem by adding additional limitations to the basic structure of FIG. 1. For example, a second metallic layer, a second dielectric layer, and a second active layer can be deposited in turn over active layer 3 of FIG. 1 such that a pair of active circuit devices are arranged in series.

While the invention has been particularly shown and described with reference to preferred embodiments thereof, it will be understood by those skilled in the art that various changes in form and details may be made therein without departing from the spirit and scope of the invention.

What is claimed is:

1. A nonlinear active circuit device comprising a thin dielectric layer positioned between and contiguous with a metallic layer and a degenerate-doped semi-conductor layer, said dielectric layer having a thickness not substantially greater than 100 A. to control tunneling of carriers between said metallic layer and said semiconductor layer, and means connected to said metallic layer and to said semiconductor layer for applying a voltage across said insulating layer sufficient to produce voltage-controlled negative resistance characteristics.

2. The nonlinear active circuit device as defined in claim 1 wherein said metallic layer is formed of aluminum, said semiconductor layer is formed of tin telluride, and said dielectric layer is formed of aluminum oxide.

3. The nonlinear active circuit device as defined in claim 1 wherein said semiconductor layer is formed of an element selected from Group IV of the periodic table.

4. The nonlinear active circuit device as defined in claim 1 wherein said semiconductor layer is formed of a Group III–V compound.

5. The nonlinear active circuit device as defined in claim 1 wherein said semiconductor layer is formed of a Group IV–VI compound.

6. The nonlinear active circuit device as defined in claim 1 wherein said semiconductor layer is formed of a Group II–VI compound.

7. A nonlinear active circuit device comprising a thin dielectric layer interpositioned between a metallic layer and a degenerate-doped semiconductor layer, said dielectric layer having a thickness not substantially greater than 100 A. to control quantum-mechanical tunneling of carriers between said metallic layer and said semiconductor layer, said semiconductor layer having a forbidden region of energy levels intermediate a conduction band and a valence band, voltage means connected to said metallic layer and said semiconductor layer and effective to move the Fermi level in said metallic layer from equilibrium and through energy levels corresponding to at least a portion of said energy levels in said forbidden region of said semiconductor material to support quantum-mechanical tunneling of carriers between said metallic layer and said semiconductor layer and produce voltage-controlled negative resistance characteristics.

8. The nonlinear active circuit device as defined in claim 7 wherein said semiconductor layer exhibits p-type conductivity to establish the Fermi level in said semiconductor layer within said conduction band such that unoccupied states are continuously available in said conduction band to support quantum-mechanical tunneling of carriers through said dielectric layer while said Fermi level in said metallic layer is moved through said energy levels corresponding to said forbidden region in said semiconductor layer.

9. The nonlinear active circuit device as defined in claim 7 wherein said semiconductor layer exhibits n-type conductivity to establish the Fermi level in said semiconductor layer within said valence band such that unoccupied states are continuously available in said valence band to support quantum-mechanical tunneling of carriers through said dielectric layer while said Fermi level in said metallic layer is moved through said energy levels corresponding to said forbidden region in said semiconductor layer.

10. An active circuit device comprising a thin dielectric layer interpositioned between and contiguous with a metallic layer and a degenerate-doped semiconductor layer, said dielectric layer having a thickness not substantially greater than 100 A. to control tunneling of carriers between said metallic layer and said semiconductor layer, said dielectric layer and said semiconductor layer each having a conduction band and a valence band separated by a forbidden region of energy levels, the forbidden region in said dielectric layer being substantially greater than said forbidden region in said semiconductor layer, the energy differences between the bottoms of said respective conduction bands and the tops of said respective valence bands in said dielectric layer and said semiconductor layer being unequal, a voltage medium connected to said metallic layer and to said semiconductor layer to support tunneling of carriers through said dielectric layer and produce voltage-controlled negative resistance characteristics.

11. The active circuit device as defined in claim 10 wherein said semiconductor layer is degenerate-doped p-type material and the energy difference at the interface between the bottom of the conduction band in said semiconductor layer and the bottom of the conduction band in said dielectric layer is less than the energy difference at the interface between the top of the valence band in said semiconductor layer and the top of the conduction band in said dielectric layer.

12. The active circuit device as defined in claim 10 wherein said semiconductor layer is degenerate-doped n-type and the energy difference at the interface between the bottom of the conduction band in said semiconductor layer and the bottom of the conduction band in said dielectric layer is greater than the energy difference at the interface between the top of the valence band in said semiconductor layer and the top of the valence band in said dielectric layer and said semiconductor layer.

References Cited

UNITED STATES PATENTS

| | | | |
|---|---|---|---|
| 3,310,685 | 3/1967 | Schmidlin | 307—88.5 |
| 3,319,137 | 5/1967 | Braunstein | 317—234 |
| 3,250,967 | 5/1966 | Rose | 317—234 |
| 3,024,140 | 3/1962 | Schmidlin | 148—1.5 |

OTHER REFERENCES

Hayashi, et al.: Observations of Negative-Resistance Phenomena and Oscillations in the MOS Diode, in Proceedings of the I.E.E., August 1964, p. 986.

I.B.M. Technical Disclosure Bulletin, vol. 5, No. 10, March 1963, Article by Magil et al., p. 126.

JOHN W. HUCKERT, *Primary Examiner.*

M. EDLOW, *Assistant Examiner.*

U.S. Cl X.R.

307—286; 317—235